United States Patent [19]

Ahn

[11] Patent Number: 5,424,103
[45] Date of Patent: Jun. 13, 1995

[54] METHOD FOR MAKING A SEMICONDUCTOR USING CORONA DISCHARGE

[75] Inventor: Byung C. Ahn, Kyungki-do, Rep. of Korea

[73] Assignee: Goldstar Co., Ltd., Seoul, Rep. of Korea

[21] Appl. No.: 145,110

[22] Filed: Nov. 3, 1993

[30] Foreign Application Priority Data

Nov. 9, 1992 [KR] Rep. of Korea ............... 20949/1992

[51] Int. Cl.⁶ .......................................... H01T 19/00
[52] U.S. Cl. ................................... 427/569; 427/570; 118/723 E; 437/937; 422/907
[58] Field of Search ............... 422/907; 427/569, 570; 118/723 E, 723 ES; 156/643; 437/937

[56] References Cited

U.S. PATENT DOCUMENTS

| | | | |
|---|---|---|---|
| 4,551,353 | 11/1985 | Hower et al. | 427/569 |
| 4,820,650 | 4/1989 | Nagae et al. | 437/10 |
| 5,082,517 | 1/1992 | Moslehi | 427/569 |
| 5,101,462 | 10/1991 | Suzuki | 422/907 |

*Primary Examiner*—R. Bruce Breneman
*Assistant Examiner*—Ramamohan Rao Paladugu
*Attorney, Agent, or Firm*—Birch, Stewart, Kolasch & Birch

[57] ABSTRACT

A method for making a semiconductor, without using a vacuum pump or vacuum chamber, using corona discharge, which comprises the steps or: supplying a reactive gas to, at least, one electrode capable of generating corona discharge above a substrate with an RF power source under the atmosphere; irradiating ions or radicals resulted from the decomposition of said reactive gas by said corona discharge to said substrate; allowing said ions or radicals to be chemically reacted with said substrate or be diffused in said substrate.

10 Claims, 4 Drawing Sheets

METHOD FOR MAKING A SEMICONDUCTOR USING CORONA DISCHARGE

BACKGROUND OF THE INVENTION

The present invention relates in general to a method for fabricating a semiconductor and an apparatus for the same, and more particularly to a method for making a semiconductor, capable of performing various processes using various gases by use of an inexpensive equipment utilizing corona discharge at atmospheric pressure.

Hereinafter, conventional fabrication methods apparatus are to be described with reference to a few drawings for better understanding of the background of the invention.

FIG. 1 shows schematically a conventional hydrogen plasma treatment apparatus. As shown in this figure, the conventional apparatus comprises a vacuum chamber 1 in which an external RF power source 2 enables a pair of cathodes 3 to generate a radio frequency, and an anode that consists of a substrate 4 supported by a supporter 5 are provided.

In the apparatus, a gas supplies system 6 which supply hydrogen ($H_2$) gas to the space between the pair of cathodes of the vacuum chamber 1 is set at the exterior of the chamber to control the quantity of hydrogen whereas an exhaust system 7 which appropriately maintains the pressure of the vacuum chamber 1 at working pressure is set at one side of the chamber.

Description for the processings with the above-mentioned hydrogen plasma treating apparatus will be given next.

Hydrogen ($H_2$) gas is supplied in the quantity of approximately 10 to 500 sccm into the vacuum chamber 1 in proportional to the size of the substrate 4 or the vacuum chamber 1. While the temperature of the substrate is maintained in a range of approximately 250° to 350° C. reaction pressure is kept in the range of a vacuum of approximately 0.1 to 1 torr by controlling the exhaust system 7.

Under such conditions, the power which is supplied to the vacuum chamber in the quantity of approximately 0.05 to 1 W/cm² from the RF power source 2 forces the hydrogen ($H_2$) to be separated into plasma which is then diffused into a semiconductor film on the substrate 4, resulting in the hydrogenation of the semiconductor film. At this time, the control of the apparatus is determined by the concentration of hydrogen radical (separated into plasma) on the surface of the substrate 4 and the hydrogen diffusion rate which is dependent on the substrate temperature.

Turning now to FIG. 2, there is shown another conventional apparatus for semiconductor hydrogenation treatment, which employs light for the hydrogenation. As shown in this figure, this apparatus comprises a chamber 1 in which a substrate 4 supported by a substrate supporter 5 is provided in a lower portion, a gas supply system supplying gas such as $H_2$ or Hg in a constant quantity, an exhaust system 7 keeping the degree of vacuum within the chamber 1 constant, dependent on the working of a vacuum pump, a quartz window 8 mounted on the upper portion of the chamber, and a low pressure mercury lamp 9 illuminating the chamber through the quartz window 8.

In such apparatus, hydrogen ($H_2$) and mercury (Hg) gases are, at the same time, supplied from the gas supply system 6 into the vacuum chamber 1 at constant flow rates, respectively. Illumination using ultraviolet rays with wavelengths of 184.9 and 254 nm causes Hg to into an excited state (Hg*) which, in turn, decomposes $H_2$ gas into radicals. The hydrogen radicals diffuse into a semiconductor film on the substrate 4 to hydrogenate it. The apparatus is controlled by the concentration of hydrogen radical on the surface of the substrate and the hydrogen diffusion rate which is dependent on the substrate temperature. The $H_2$ concentration is determined by the partial pressures of $H_2$ and Hg within the vacuum chamber 1.

The conventional apparatuses for the treatment of semiconductor hydrogenation and methods according to the same show problems as follows: first, since the hydrogenation processes are carried out within the vacuum chamber 1, an exhaust system must be required; second, accordingly, the high cost of equipment is needed due to the high priced chamber and the exhaust system; third, the time for treating the substrate is lengthened because processes are carried out in a vacuum state; fourth, if the apparatus shown in FIG. 1 is used in a process which is mainly performed under atmospheric, pressure the time needed to form a vacuum within the vacuum chamber becomes a factor that lowers the productivity; fifth, since the apparatus described with reference to FIG. 2 use mercury (Hg), there occurs pollution problems; sixth, in case that a large substrate is made, it is required to large make large the quartz window 9 passing the light irradiated from the low pressure mercury lamp 9; a large as well; and finally, since the low pressure mercury lamp is unable to uniformly illuminate a large area, it is difficult to make a semiconductor with high quality.

SUMMARY OF THE INVENTION

Therefore, which is an object of the present invention is to solve the aforementioned problems encountered in the prior art and to provide a method for making a semiconductor, capable of consistently producing semiconductors in mass and improving the productivity, along with an apparatus for the method.

According to an aspect of the present invention, this object can be accomplished by providing a method for making a semiconductor which comprises the steps of: supplying a reactive gas to, at least, one electrode capable of generating corona discharge above a substrate with an RF power source under the atmospheric pressure; irradiating ions or radicals resulted from the decomposition of said reactive gas by said corona discharge to said substrate; allowing said ions or radicals to be chemically reacted with said substrate or to be diffused in said substrate.

According to another aspect of the present invention, this object can be accomplished by providing an apparatus comprised of: at least one electrode installed above a substrate supporter, said electrode generating corona discharge with an RF power source; a gas supply system supplying a reactive gas to said electrode; an exhaust system installed around said substrate support and said electrode, said exhaust system preventing the substrate from being contaminated by external air.

The above and other objects and advantages of the present invention will become more apparent as the following description proceeds.

To the accomplishment of the foregoing and related ends, the invention, comprises the features hereinafter fully described in the specification and particularly pointed out in claims. The following description and the annexed drawing setting forth in detail a certain illustrative embodiment of the invention is not intended to be limitive. Rather it is but one of the various ways in which the principles of the invention may be employed.

DETAILED DESCRIPTION OF THE INVENTION

Figure 1:
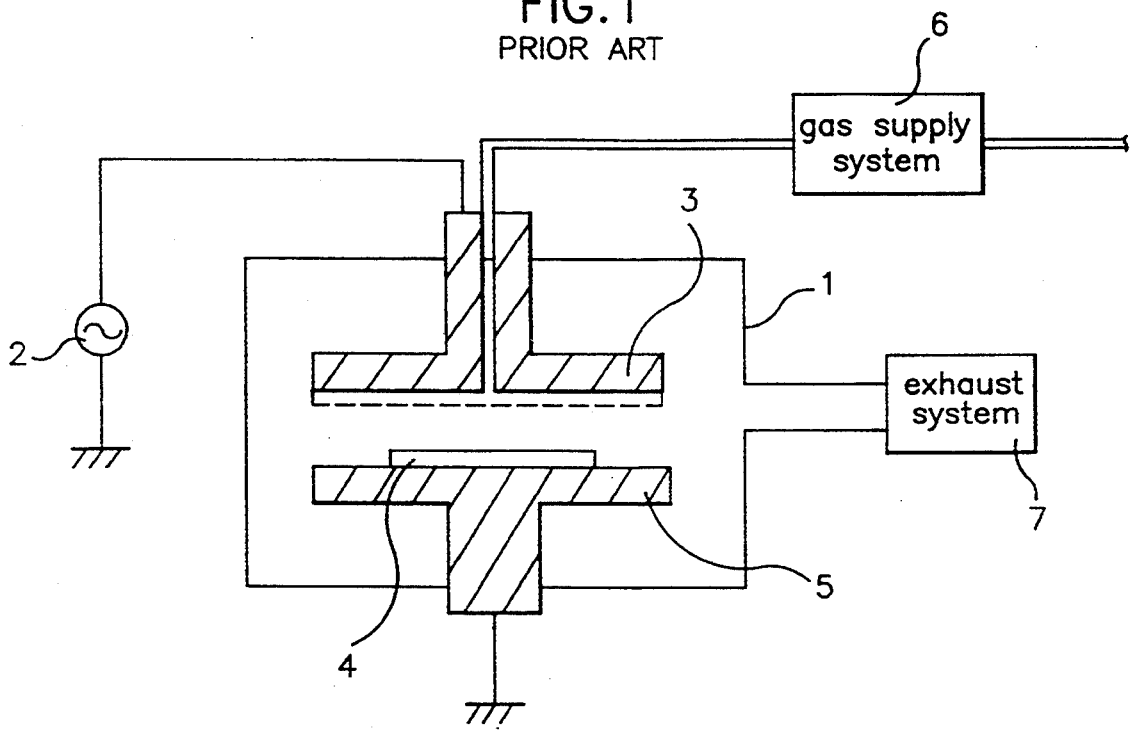
FIG. 1 is a schematic sectional view illustrating a conventional apparatus for hydrogenating semiconductor.
Figure 2:
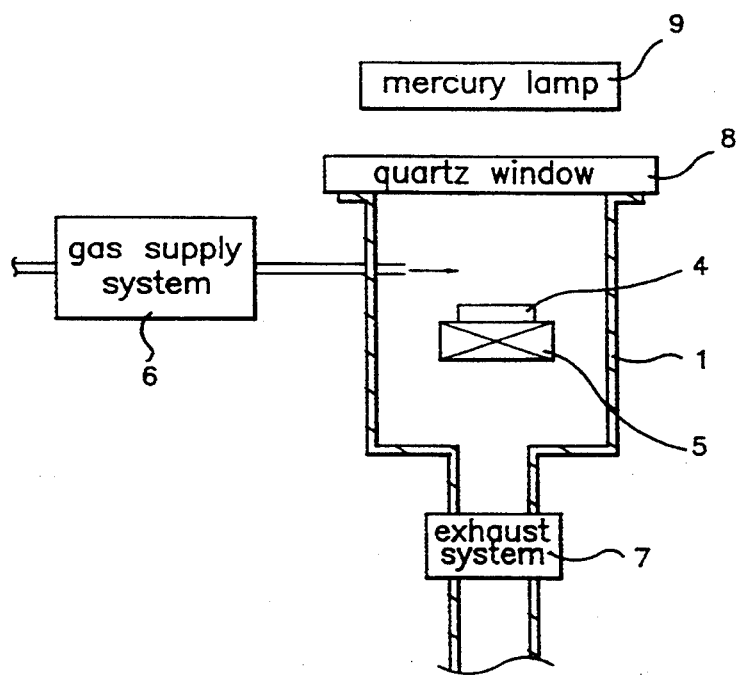
FIG. 2 is a schematic sectional view illustrating another conventional apparatus for hydrogenating semiconductor.
Figure 3A:
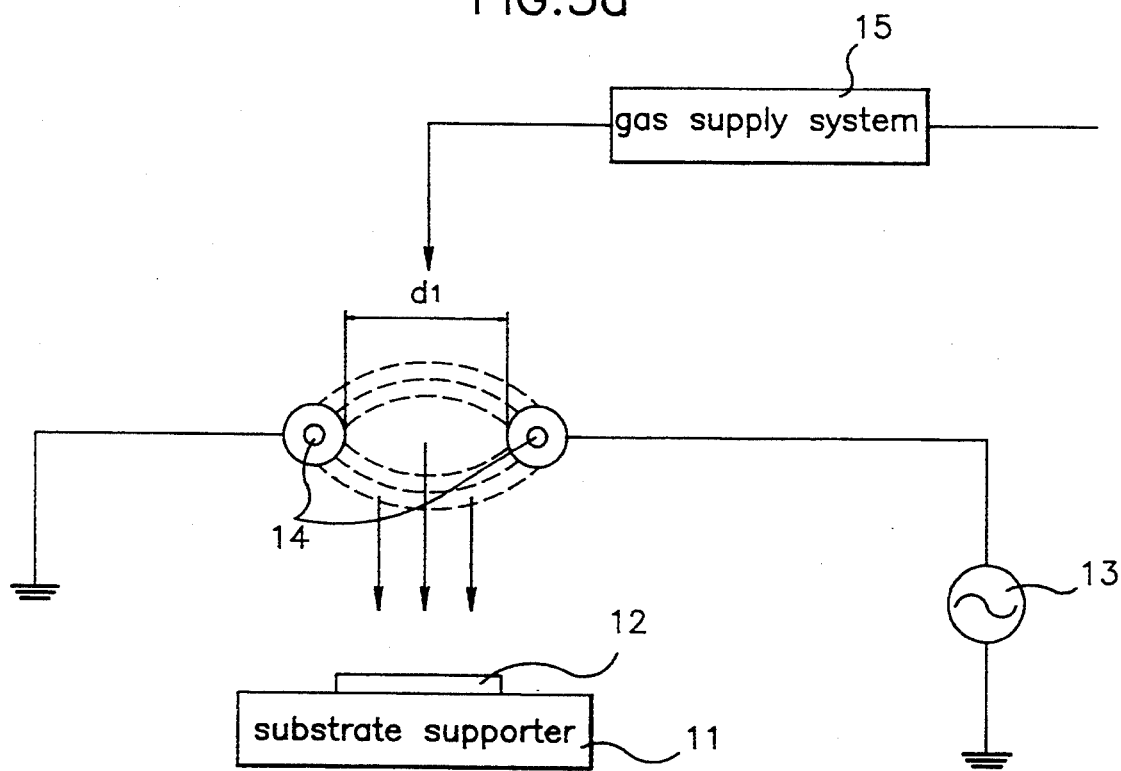
FIGS. 3a and 3b are schematic views explaining a semiconductor treatment apparatus in accordance with the present invention.
Figure 3B:
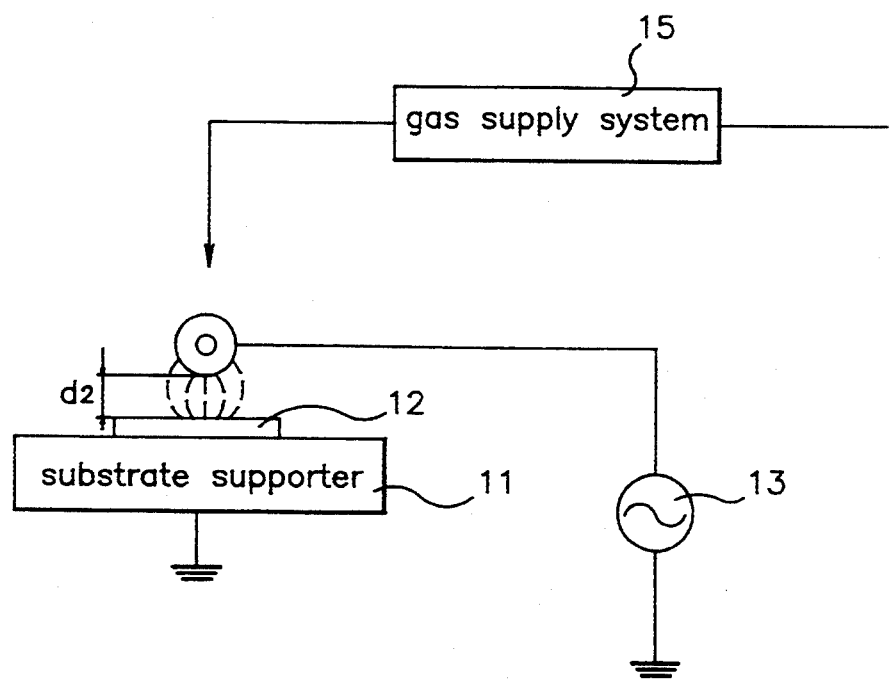

Hereinafter, preferred embodiments of the present invention will be described in detail with reference to several drawings wherein like reference numerals designate like parts. FIG. 3 schematically shows a semiconductor treatment apparatus according to the present invention. As shown in the figure, the apparatus according to the present invention comprises a substrate supporter 11 supporting a substrate 12 thereon and heating it at a constant temperature, an power source 13 applying RF electric R.F. power so as to generate a corona discharge, at least an electrode 14 connected with the R.F. power source and a gas supply system 15. For treating the substrate, above the substrate supporter 11 supporting the substrate 12 thereon, are provided a pair of electrode 14 which are connected with the RF power source 13 and ground earth, respectively, as shown in FIG. 3A. Alternatively, only an electrode 14 is provided which is connected with the RF power source 13, while the substrate supporter 11 supporting the substrate 12 is grounded, as shown in FIG. 3B. In any cases, application of the RF power source generates a corona discharge between a pair of electrodes 14, or the electrode 14 and the substrate support 11.

In the state that the corona discharge occurs, as reactive gas selected from the group consisting of $H_2$, $O_2$, $SiH_4$, $SiF_4$, $Si_2H_6$, $GeH_4$, $Ge_2H_6$, He, Ar, O, $CF_4$, $SF_6$, $CH_2F_2$, $NF_3$, $CCl_2F_2$, $Cl_2$, $CCl_4$, $WF_6$, $2MoCl_5$, $Cr[C_6H_5CH(CH_3)_2]_2$, $Al(C_4H_9)_3$ is supplied from the gas supply system into the upper region of the electrode 14. The electrons which are exited between a pair of the electrodes 14 make the molecules of the reactive gas become ions and radicals with high energies. The ions and radicals with high energies which are generated by the corona discharge cause chemical reaction or diffusion on the surface of a semiconductor.

Such processes are performed under the atmosphere pressure. While the processes proceed, it is preferred to supply nitrogen ($N_2$) to the surrounds of the electrode 14 in order to prevent the substrate from being contaminated with other gases (the air) besides the reactive gas.

The electrode used in the present invention includes a high melting metal such as W, Ta and the like and is subjected to surface treatment by use of MgO or $SiO_2$.

The R.F. power source used in the present invention employs a high frequency power source of above 100 KHz in order to prevent arc discharge and to constantly generate a corona discharge.

An field which is generated by the power source and determined by the distance $d_1$ between the electrodes 14 or the distance $d_2$ between the electrode 14 and the substrate 12, is preferably above 1 KV/mm (for example, $d_1$, $d_2 = 5$, 5KV).

Figure 4:
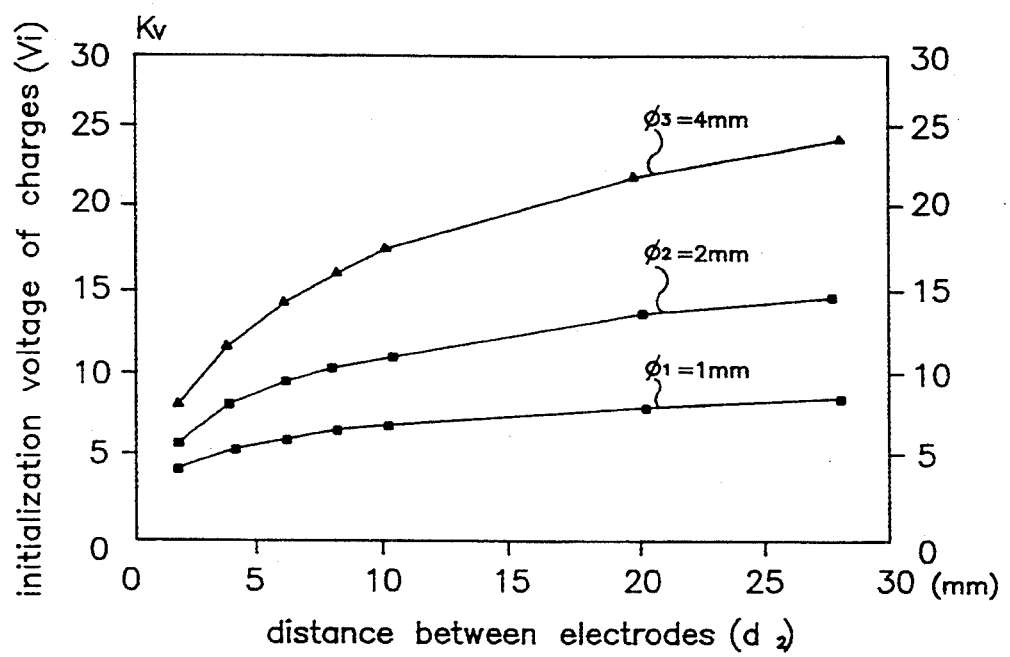
FIG. 4 is a graph of a relation between the inter-electrode distance and the discharge initiation voltage in accordance with the present invention.

Referring now to FIG. 4, there is shown dependency of initialization voltage of charge (Vi) on the distance $d_2$ between electrodes of FIG. 3B. From the curves for different diameter cases, that is, $\phi_1 = 1$ mm, $\phi_2 = 2$ mm, $\phi_3 = 4$ mm, it is found that Vi is in proportional to log $d_2$. In addition, as the diameter of the electrode is made small, the Vi value becomes reduced.

For example, using a high frequency power source with a frequency 80 KHz, discharge is initialized at 6 KV in the apparatus of FIG. 3A under such a condition that the electrode is, made of a tungsten line enveloped with melted $SiO_2$, where the distance $d_1$ is 2 mm and hydrogen is supplied in the quantity of 200 sccm.

Figure 5:
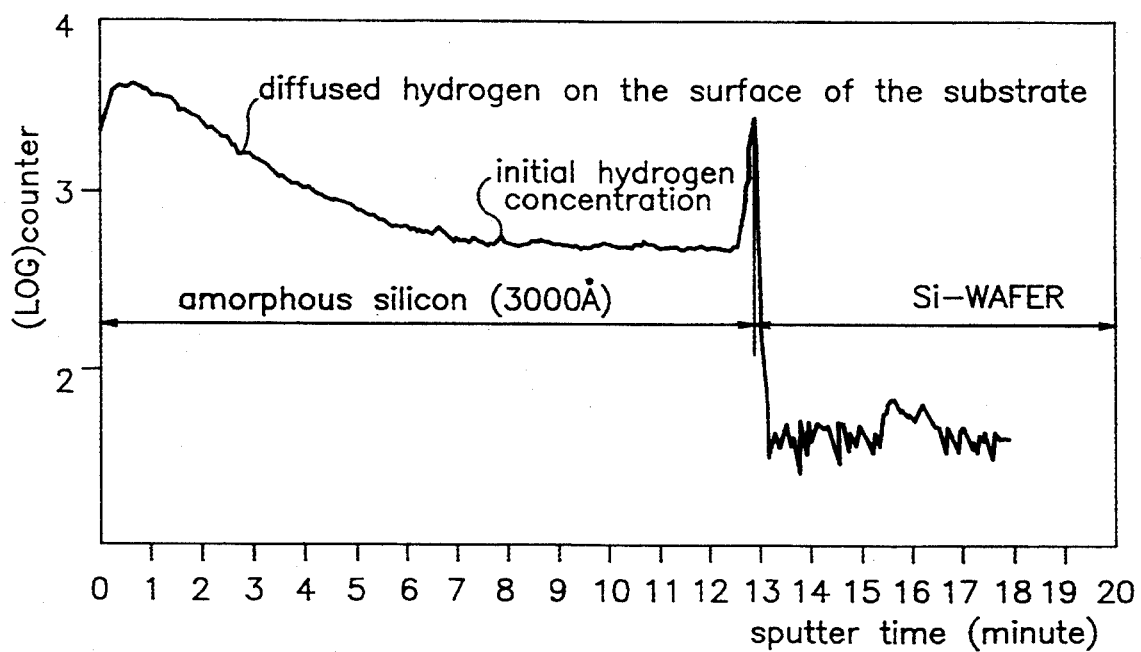
FIG. 5 is an analysis graph of a hydrogen distribution in a silicon wafer formed with an amorphous silicon film and hydrogenated in accordance with the present invention.

Turning now to FIG. 5, there is shown a profile illustrating the distribution state of hydrogen within an amorphous silicon film which is formed on a silicon wafer (substrate) in a thickness of 3,000 Å by low pressure chemical vapor deposition (LPCVD), heated to 350° C., and then, treated at 8 KV for 30 minutes according to the present invention. From the profile, it is apparent that the $H_2$ concentration within the surface is at least 8 times as much as the initial concentration. In addition, since the concentration of hydrogen according to the depth of the amorphous silicon is profiled as an error function, the substrate is hydrogenated by the hydrogen diffusion dependent on the substrate temperature.

Figure 6A:
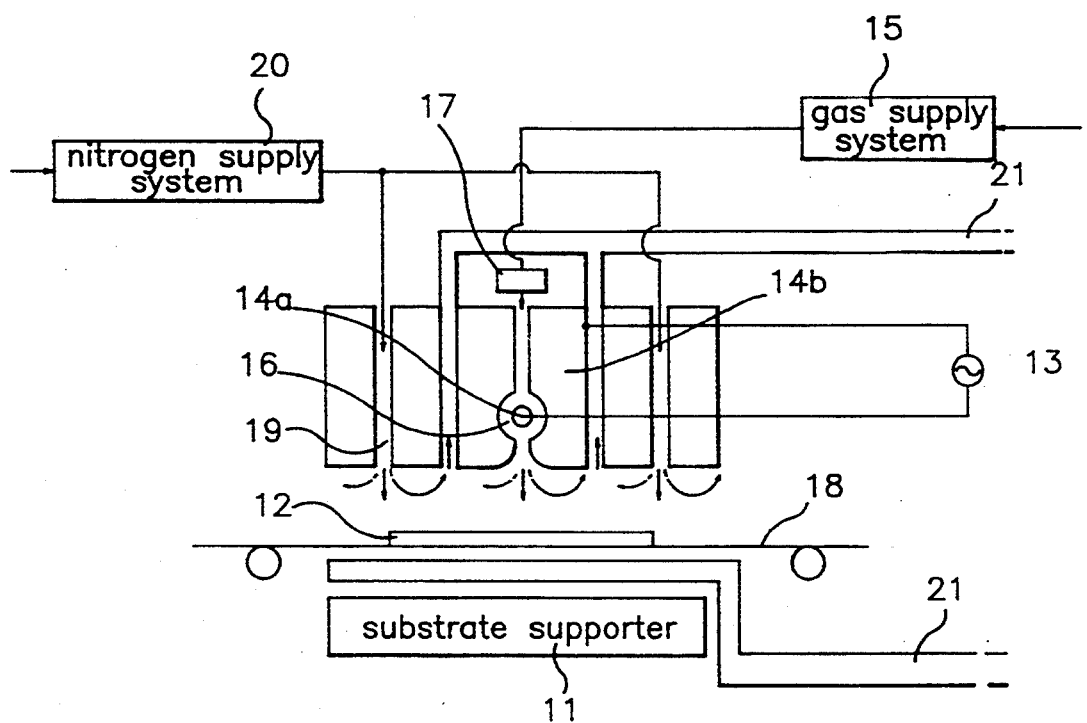
FIGS. 6a and 6b are a sectional view and a cross-sectional view illustrating a semiconductor treatment apparatus in accordance with an embodiment of the present invention.
Figure 6B:
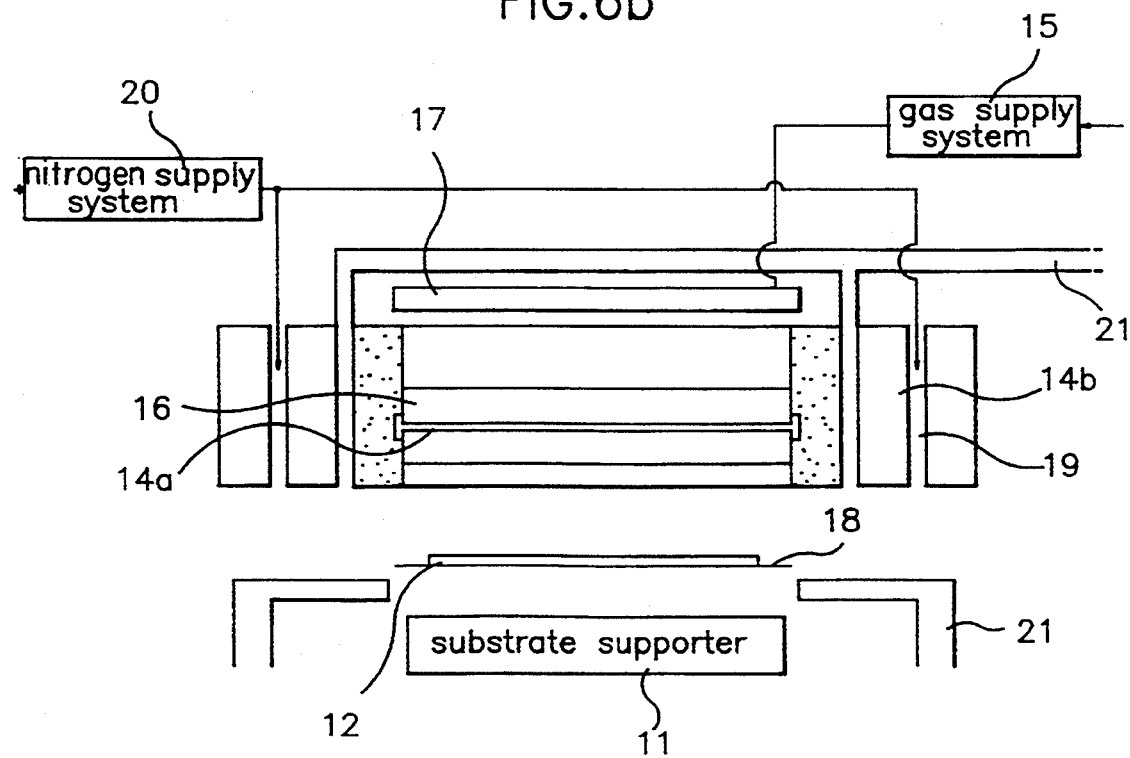

A preferred embodiment is to be described with reference to FIGS. 6a and 6b. In accordance with the present invention, a semiconductor thin film formed on a large sized insulating film is capable of being treated in sequence under atmospheric pressure. An electrode which causes corona discharge is comprised of a first electrode 14a and a second electrode 14b. The first electrode 14a which is made of a metal selected from the group consisting of W, Nb, Ta and Mo is coated with a metal oxide film selected from the group consisting of $Ta_2O_5$, $Nb_2O_5$, $SiO_2$ and MgO, and the surface of the second electrode is treated as well with a metal oxide film. The second electrode 14b is formed in the outside of the first electrode 14a in such a way to provide, at least, a discharge chamber 16 which has a tube shape and extends in an X direction. The first electrode 14a is shaped as a line or a bar and has a diameter of at least 1 mm. A reactive gas is supplied into the space between the first electrode 14a and the second electrode 14b, that is, the discharge chamber 16 by a gas supply system 15 which also controls the flow rate so as to supply the gas at a constant quantity.

A diffuser 17 is provided at an upper portion of the discharge chamber 16, which plays a role in supplying the reactive gas more uniformly.

An RF power source 13 used in the apparatus according to the present invention employs an AC voltage that has a maximum level of 20 KV at 80 KHz. The RF power source 13 is connected between the first electrode 14a and the second electrode 14b.

Ions and radicals with high energies which result from the decomposition of the reactive gas are passed through a nozzle which has a taper slit shape.

A substrate 12 is laid on a timing belt 18 which is disposed above a substrate supporter 11 and fed to the substrate supporter 11, followed by heating of the substrate 12 to a predetermined temperature. The processing degree is controlled by the flow rate of reactive gas, the discharge voltage, the feed speed, and the heating temperature of the substrate temperature. Nitrogen ($N_2$) gas is supplied to the exterior of substrate 12 in order to prevent the reactive gas from being leaked and to protect the apparatus from being contaminated with the air. The nitrogen gas is supplied from a nitrogen supply system 20 via a nitrogen inlet 19 so that the leakage of the reactive gas and the contamination of the substrate can be prevented. Exhaust systems 21 which exhaust the reactive gas are placed above the timing belt 18 and at the outside thereof. Unreacted gas may pollute the air, and thus it is not exhausted until it is oxidized with oxygen.

The dependence of the production process on the kind of the reactive gas will be further described with reference to specific examples.

EXAMPLE 1

A Process for Doping Impurities in a Wafer

Instead of hydrogen gas as preferably used in the present invention, phosphine ($PH_3$), diborane ($B_2H_5$) and arsine ($AsH_3$) gas containing 3 or 5 valence elements which are gases for doping semiconductor impurity were supplied to the discharge chamber 16 via the gas supply system 15 and the diffuser 17, decomposed by means of corona discharge, and diffused in the semiconductor thin film on the surface of the substrate 12 to give an n type or p type semiconductor.

As compared with a conventional semiconductor doping method whereby ions are diffused at a high temperature to be implanted, the method according to the present invention whereby 3 or 5 valence elements to be decomposed with a high energy are irradiated to the substrate under the atmosphere allows a large-sized substrate including a semiconductor thin film to be treated with impurities on a large scale.

EXAMPLE 2

A Process for Washing a Surface and Removing a Polymer Film

Instead of hydrogen ($H_2$) gas as preferably used in the present invention, oxygen ($O_2$) gas was decomposed to irradiate oxygen ions and radicals with high energies to the surface of the substrate 12.

The oxygen ions and radicals with high energies react with the organic materials remaining on the surface of the substrate 12 so as to oxidize and remove them.

Such process applicable to an ashing process is which is for removing a photoresist film and is capable of being carried out in a large scale by using high energy oxygen ions and radicals under atmospheric pressure, as compared with a conventional dry etch or UV ashing process.

EXAMPLE 3

A Process for Forming a Semiconductor Film

Instead of hydrogen ($H_2$) gas as preferably used in the present invention, silane gases ($SiH_4$, $Si_2H_6$, $SiF_4$) was decomposed by means of corona discharge to irradiate the silane ions and radicals with high energies to the surface of the substrate 12. As a result, an amorphous silicon film or a polysilicon film was formed.

While the conventional apparatus for forming a semiconductor film is comprised of a high priced vacuum installation, the inventive apparatus is capable of being carried out for forming a semiconductor film in sequence under atmospheric pressure.

EXAMPLE 4

A Process for Forming Insulating Film

Instead of hydrogen ($H_2$) gas as preferably used in the present invention, silane gases ($SiH_4$, $Si_2H_6$, $SiF_4$) were used in admixture with oxidative gases ($O_2$, $N_2O$) or a gas for nitride film ($NH_3$)w to form a silicon oxide film and a silicon nitride film.

Also, instead of the silane gases, a reactive gas containing various metals such as $WF_6$, $MoCl_5$, $Cr[C_6H_5CH(CH_3)_2]_2$ and $Al(C_4H_9)_3$ was admixed with an oxidative gas or a gas for nitride film to form a metal oxidative gas or metal nitride film.

EXAMPLE 5

A Dry Etch Process

Instead of hydrogen ($H_2$) gas as preferably used in the present invention, a gas for a dry etch, such as $CF_4$, $NF_3$, $CH_2F_2$, $SF_6$, $CCl_2F_2$ was decomposed by means of a corona discharge to irradiate the gas ions and radicals with high energies on the surface of the substrate 12. As a result, the inventive process allows a dry etch process to be applied to a metal film, semiconductor film and insulating film.

As described hereinbefore, gases selected for desirable purposes can be decomposed by means of corona discharge to irradiate the ions and radicals of the gas to a substrate surface, resulting in chemical reactions or diffusion of the ions and radicals under the atmosphere in accordance with the present invention. Accordingly, a large-sized substrate can be treated with improved efficiency according to the present invention. In addition, the apparatus according to the present invention can be used in a process that is carried out under atmospheric pressure, thereby enabling a total production process to proceed in sequence and bringing about such an effect that semiconductors are consistently produced in mass.

What is claimed is:

1. A method for making a semiconductor using corona discharge without using a vacuum pump or a vacuum chamber, which comprises the steps of:
    forming a corona discharge region above a substrate supporter having a substrate supported thereon by supplying radio frequency power to an electrode positioned above the substrate;
    supplying a first gas to said corona discharge region so as to create ions or radicals;
    isolating ambient air from said corona discharge region by supplying a second gas so as to surround said corona discharge region to which said first gas is supplied, thereby allowing said created ions or radicals to chemically react with, or to diffuse into, said substrate at atmospheric pressure.

2. The method according to claim 1, of said reactive gas supplied into said electrode in order to preventing the leakage of said reactive gas and the contamination wherein said second gas is nitrogen ($N_2$).

3. The method according to claim 1, wherein said first gas is hydrogen ($H_2$), said hydrogen gas being decomposed by said corona discharge into hydrogen ions or radicals.

4. The method according to claim 1, wherein said first gas is oxygen ($O_2$) gas, said oxygen gas being decomposed by said corona discharge into ions or radicals which react with said substrate to form an oxide film on the surface of said substrate.

5. The method according to claim 1, wherein said first gas is selected from the group consisting of $SiH_4$, $SiF_4$ and $Si_2H_6$, said first gas being decomposed by corona discharge into ions or radicals including silicon so as to form an amorphous silicon or polysilicon on said substrate.

6. The method according to claim 1, wherein said first gas is selected from the group consisting of $GeH_4$, $GeF_4$ and $Ge_2H_6$, said first gas being decomposed by corona discharge into ions or radicals which form an amorphous germanium or polygermanium on said substrate.

7. A method according to claim 1, wherein said substrate is silicon, said first gas is a gas containing oxygen (O) or nitrogen (N), said first gas being decomposed by corona discharge into ions or radicals to form a silicon oxide film or a silicon nitride film on said substrate.

8. A method according to claim 1, wherein said first gas is selected from the group consisting of $CF_4$, $SF_6$, $CH_2F_2$, $NF_3$, $CCl_2F_2$, $Cl_2$ and $CCl_4$, to etch materials on the surface of said substrate.

9. A method according to claim 1, wherein said first gas is selected from the group consisting of $WF_6$, $MoCl_5$, $Cr[C_6H_5CH(CH_3)_2]_2$ and $Al(C_4H_9)_3$, said gas being decomposed by corona discharge into ions or radicals so as to deposit a metal selected from the group consisting of W, Mo, Cr, and Al.

10. A method for making a semiconductor using corona discharge without using a vacuum pump or a vacuum chamber, which comprises the steps of:

forming a corona discharge region above a substrate supporter having a substrate supported thereon by supplying radio frequency power to an electrode positioned above the substrate;

supplying a reactive gas, selected from the group consisting of SiH(sub4), SiF(sub4) and Si(sub2)H(sub6), to said corona discharge region so as to create ions or radicals;

isolating ambient air from said corona discharge region by supplying a gas such as Helium (He) or Argon (Ar) so as to surround said corona discharge region and which reacts with said reactive gas to form an amorphous silicon or polysilicon film on the surface of said substrate.

* * * * *